United States Patent [19]
Butler et al.

[11] 4,039,940
[45] Aug. 2, 1977

[54] CAPACITANCE SENSOR

[75] Inventors: Walter J. Butler, Scotia; Charles W. Eichelberger, Schenectady, both of N.Y.

[73] Assignee: General Electric Company, Schenectady, N.Y.

[21] Appl. No.: 710,177

[22] Filed: July 30, 1976

[51] Int. Cl.² ............................................ G01R 27/26
[52] U.S. Cl. .................................................. 324/60 C
[58] Field of Search ............. 324/60 C, 60 CD, 60 R; 200/DIG. 1

[56] References Cited
U.S. PATENT DOCUMENTS

| | | | |
|---|---|---|---|
| 3,882,380 | 5/1975 | Black | 324/60 C |
| 3,886,447 | 5/1975 | Tanaka | 324/60 CD |

FOREIGN PATENT DOCUMENTS

| | | | |
|---|---|---|---|
| 1,791,234 | 8/1971 | Germany | 324/60 CD |

*Primary Examiner*—Stanley T. Krawczewicz
*Attorney, Agent, or Firm*—Stephen B. Salai; Joseph T. Cohen; Jerome C. Squillaro

[57] ABSTRACT

A unknown value of capacitance is determined by the repeated transfer of quantities of charge from a potential store in amounts proportional to the value of the unknown capacitance. Transfer is accomplished during at least two distinct periods of a measurement cycle so that capacitance may be expressed as a ratio of a known and an unknown capacitance in order to eliminate certain circuit related errors.

13 Claims, 13 Drawing Figures

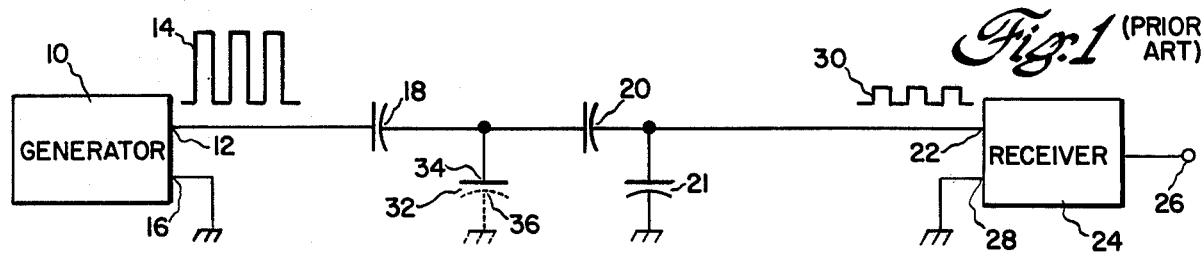
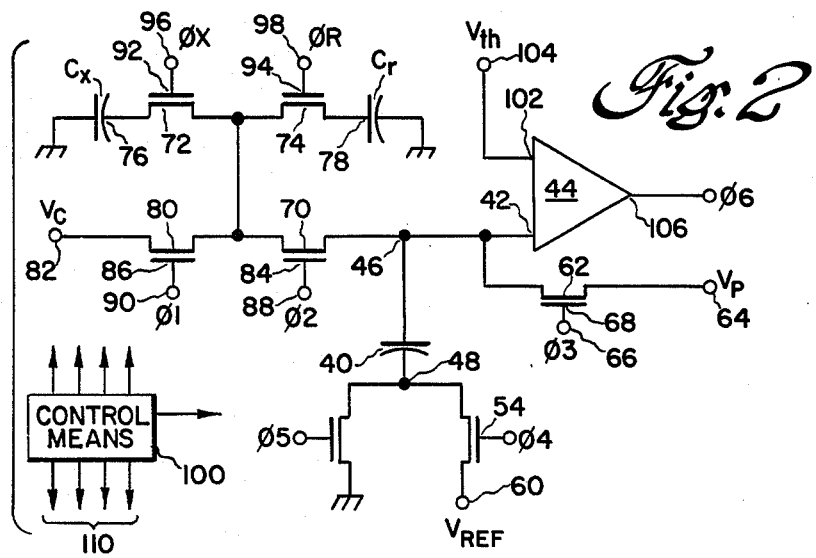
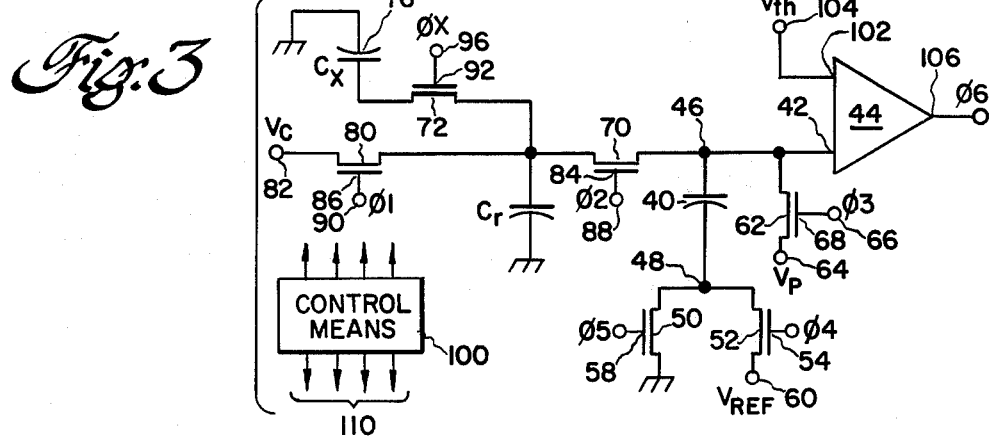
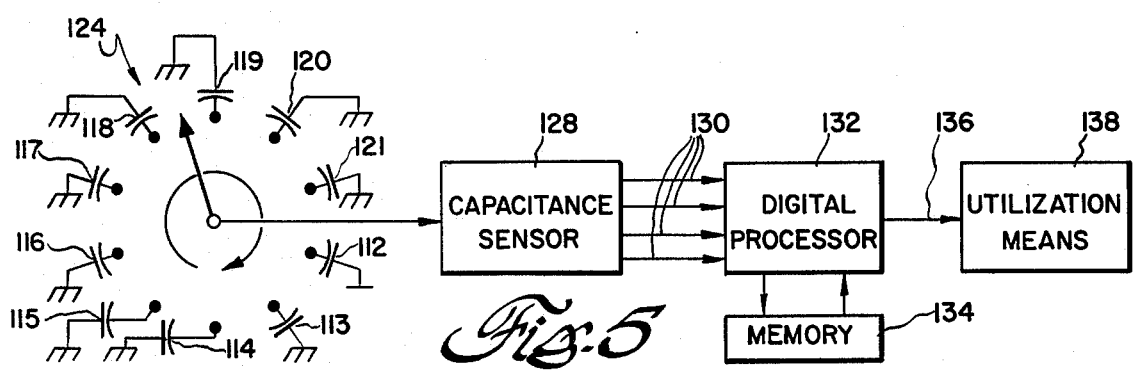

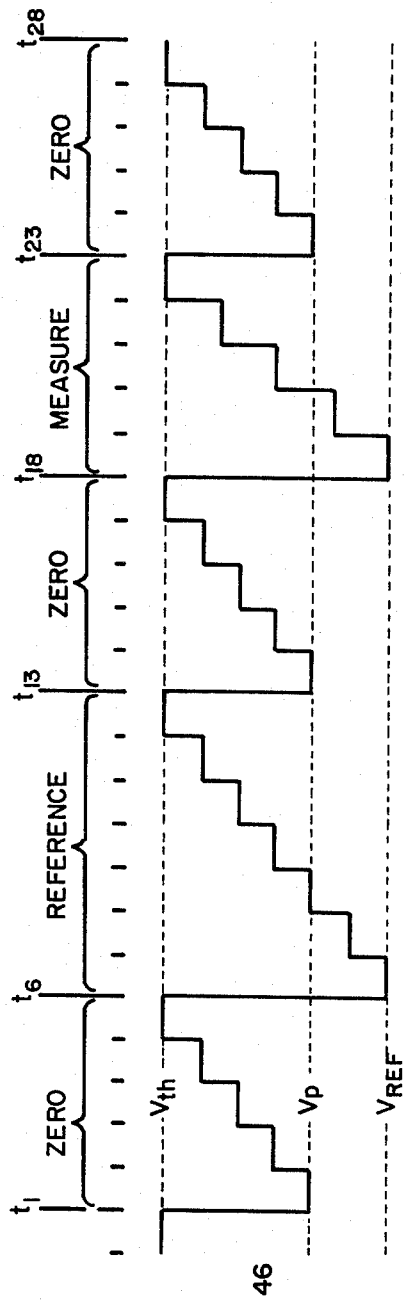

CAPACITANCE SENSOR

This invention relates in general to capacitance measurement and more particularly to a method and apparatus for measuring an unknown value of capacitance by the repeated transfer of charge from a potential well in an amount proportional to the value of capacitance to be measured.

It is often times desirable to provide in digital form an indication of the value of an unknown capacitance. Aside from the need in certain applications for measuring the value of unknown capacitances solely for the determination thereof, it is often times advantageous to utilize capacitance as a parameter in the determination of another variable. For example, a change in capacitance may readily be utilized as a method for entering data into a system, for example, a control system wherein the actual value of capacitance may be irrelevant except to the extent that it indicates the value of the data which is desired to be entered. A rather basic, but increasingly important, example of this type of data entry may be found in the use of capacitive "touch sensors" in systems where it is desirable to provide substantial isolation between the equipment operators and the system control circuits. An example of this may be found in appliance control applications wherein it is desirable to provide a high degree of safety in an environment which may not be conducive thereto. It would not be unreasonable to expect to find extremely hazardous conditions existing in the operating environment of such appliances, as for example, to find the operator standing in a pool of water or the like. In such cases, the exposure of the operator to voltage sources of any substantial magnitude whatsoever is not only undesirable but intolerable.

Capacitively operated touch sensors provide or attempt to provide, input devices which are, in varying degrees, effective to eliminate or at least partially eliminate some of the hazards heretofore described. Typically, a capacitive touch sensor of the type commonly found in the prior art includes a relatively high voltage pulse generating device coupled to a capacitive touch plate and then to a receiving device which is responsive to the pulses generated. The degree of coupling between the generating device and the receiving device is arranged so that upon touching the "touch plate" a substantial attenuation of the signal received at the detecting device occurs. Since the magnitude of capacitance change which occurs upon the application of, for example, a finger to a touch plate, is small, relatively high voltages must be generated in order to provide reliable detection of an input event, that is to say, the touching of the touch sensitive plate by the operator. Further, the detector circuits must provide detectors having relatively high sensitivity to small changes in signal level applied thereto and additionally must have stable long term operating characteristics.

It has been the practice to provide detectors in the prior art of the type which include a preset absolute threshold level of signal which must be reached in order to provide an input event. Generally, the threshold level is selected to provide a range of acceptable triggering levels so that component aging as well as other types of short and long term instabilities caused, for example, by environmental factors, will nevertheless provide reliable operation. Insofar as is known, prior art touch sensors have been of the bistable analog type hereinabove described. They provide an "on" or "off" indication of an input event. The increasing usage of digital electronic circuits in control systems makes it both desirable and useful to include sensors in such control systems which provide direct digital information.

Accordingly, it is an object of this invention to provide capacitive measurement apparatus which directly converts an unknown capacitance to a digital output signal representative thereof.

It is another object of this invention to provide a capacitive touch sensor having a digital output.

It is yet another object of this invention to provide a capacitive touch sensor which may be fabricated according to metal-oxide semiconductor (MOS) technology.

It is a further object of this invention to provide capacitive measurement means specially suited to be utilized in a touch sensor circuit.

It is still a further object of this invention to provide a touch sensor which does not require the high voltage signals of prior art types.

Briefly stated and in accordance with one aspect of this inventon, digital capacitance measurement apparatus is provided wherein a first charge storage location or potential well which may conveniently be an MOS capacitor is provided having a threshold detector connected to one terminal thereof responsive to a preselected voltage level appearing at the terminal to provide an output signal whenever the preselected voltage level is reached or exceeded. A relatively smaller capacitive charge storage location is connected to the first terminal through controllable switch means in order to accomplish the successive transfer of a plurality of charge packets to the potential well from the second relatively smaller capacitive charge storage location. Further, switch means are provided for selectively filling the second charge storage location between transfers. Additional switch means are provided for selectively coupling an unknown capacitance to the second potential well during a portion of the transfers of charge to the primary well thereby modifying the amount of charge transferred during that portion when the unknown capacitance is connected. By repetitively transferring charge to the primary potential well until the aforementioned threshold detector provides an indication of the reaching of the preselected level of charge, and by metering the number of transfers required to reach the preselected level both with the unknown capacitance connected and with the unknown capacitance disconnected, a ratio is generated which is proportional to the unknown capacitance.

In accordance with embodiment of this invention, switch means are provided to selectively couple a known magnitude reference capacitance to the primary potential well during a first portion of a measurement period and to selectively couple an unknown value of capacitance to the primary potential well during a second portion of a measurement period, the ratio of the number of transfers of charge required in each of the first and second periods to cause the voltage in the primary potential well to reach the preselected threshold value being proportional to the ratio of the reference to the unknown capacitances.

In accordance with another embodiment of this invention a reference capacitor is provided which is at all times utilized as at least a portion of the capacitance utilized to define the magnitude of the packet of charge being transferred to the primary potential well and which is utilized in combination with the unknown capacitance during a second portion of a measurement cycle. The ratio of the number of transfers required during the two portions of the cycle to reach the aforementioned threshold level being proportional to the ratio of the combination of the known and unknown capacitances to the value of the known capacitance alone.

The features of the invention which are believed to be novel are pointed out with particularity in the appended claims. The invention itself, however, both as to its organization and method of operation together with further objects and advantages thereof may best be understood by reference to the following description taken in connection with the accompanying drawings in which:

FIG. 1 is a block diagram schematic of a touch sensor in accordance with the prior art.

FIG. 2 is a partial schematic, partial block diagram of a capacitance measuring device in accordance with a presently preferred embodiment of this invention.

FIG. 3 is a partial schematic, partial block diagram of an alternative embodiment of capacitance measurment apparatus in accordance with this invention.

FIG. 4a —4i a waveform diagram of certain of the voltages present in the circuits of FIGS. 2 and 3 with respect to time Referring now to FIG. 1, there is illustrated in block diagram form a touch sensor in accordance with the prior art. A generator 10 supplies a series of pulses at output 12 thereof which pulses are of the general waveform illustrated at 14. Typically, these pulses have a magnitude of 50 or more volts extending in some cases as high as several hundred volts. Output 16 of generator 10 is connected to ground. Output 12 is connected through capacitor 18 to capacitor 20 which is connected to input 22 of receiver 24. Receiver 24 is responsive to the pulses produced by generator 10 to provide an output signal at terminal 26 thereof whenever the magnitude of pulses received at input 22 with respect to input 28 which is connected to ground, is less than a predetermined threshold level. The magnitude of the pulses received at input 22 of receiver 24 which pulses are indicated schematically at 30, is determined by the relative magnitudes of the several capacitances shown. Capacitor 32 which is shown having one plate thereof illustrated in phantom, is the touch plate capacitor. Capacitor 32 has one physical plate 34, which is the touch pad and which is shown as the juncture of capacitors 18 and 20. The capacitance 32 represents the body capacitance of the operator; when the operator's finger touches the touch pad 34, capacitance 32 is connected between 32 and ground. Capacitors 18 and 32, and capacitances 20 and 21 thereby provide a capacitive voltage divider which reduces the magnitude of the voltage applied to input 22 of the receiver 24. The reduction in signal voltage is therefore a function of the magnitude of capacitor 32. It will be apparent to those skilled in the art that other factors in addition to the touching of plate 34 by an operator will cause changes in the magnitude of the signal applied to input 22 of receiver 24. These include variations in the size of the parasitic load capacitance, the aging of components, variations in processing parameters, drift and other instabilities caused by thermal cycling and other environmental factors, changes in power supply voltage and other similar factors. Accordingly, receiver 24 must be operative to tolerate a range of nominal input signal voltage levels (corresponding to no-touch condition) and a range of changes in applied signal voltage (corresponding to a "touched" condition) while at the same time providing a reliable indication of a touched condition of capacitor 32. It is common practice, therefore, to provide a "dead band" of voltage changes below the maximum voltage expected to be received, which dead band will not result in a response by receiver 24 producing an output at output 26 thereof. This dead band of voltage changes reduces the ultimate sensitivity of the device and is in part responsible for the requirement that relatively high voltage pulses 14 be supplied by generator 10.

Many advantages over the circuit of FIG. 1 may be obtained through use of the instant invention which is illustrated in a presently preferred form in the schematic of FIG. 2. A first capacitive charge storage location 40 is connected to input 42 of threshold detector 44. In accordance with this invention, charge storage location 40 may conveniently be a capacitor as, for example, an MOS capacitor formed on an integrated circuit substrate. It will be appreciated by those skilled in the art that while the circuit of FIG. 2 is especially adapted to be formed in integrated form, that this invention is not so limited and that the circuit of FIG. 2 may be readily fabricated in discrete form utilizing readily available components. Similarly, the technique for converting the value of a capacitor to a digital equivalent thereof as exemplified by the circuit of FIG. 2 is susceptible to be implemented in any of a wide variety of physical forms wherein a potential well is provided having the capacity to store charge therein and to create a potential at a first terminal thereof which potential is related to the quantity of charged stored. Such a potential well might be formed, for example, at the surface of a semiconductor by the creation of an electric field thereat.

Capacitive charge storage location 40 has first and second nodes 46 and 48 associated therewith which nodes are connected to input 42 of detector 44 and to semiconductor switches 50 and 52, respectively. In accordance with a presently preferred embodiment of this invention, switches 50 and 52 are MOS field effect transistor switches having gate electrodes 54 and 58 associated therewith for connecting node 48 either to ground or to terminal 60 upon the application of an appropriate energizing signal to electrodes 54 and 58. Node 46 of capacitive charge storage location is connected through transistor switch 62 to terminal 64 which is adapted to be connected to a source of precharge voltage $V_P$. An appropriate gate energizing signal is applied to terminal 66 which is connected to gate electrodes 68 in order to apply voltage $V_P$ to node 46. Node 46 is further connected through transistor switch 70 to the juncture of transistor switches 72 and 74 which are connected to first terminals 76 and 78 of capacitors $C_x$ and $C_n$, respectively, the opposite terminals of which are connected in each case to ground. Semiconductor switch 70 is further connected through switch 80 to terminal 82 which is adapted to be connected to a source of charging voltage $V_C$. Switching devices 70 and 80 are provided with gate electrodes 84 and 86, respectively, which are connected to terminals 88 and 90 to which appropriate control voltages are applied in order to sequentially energize electrodes 84 and 86 to turn devices 70 and 80 on and off in a controlled manner. Similarly, switching devices 72 and 74 are provided with electrodes 92 and 94 and connected to terminals 96 and 98 for connection to appropriate energizing voltages to control the switching operation of the devices. Control means 100 is provided having a plurality of outputs for providing waveforms to control the operation of the switching transistors hereinabove described. The waveforms produced by control means 100 are illustrated in exemplary form in FIG. 4 and will be described in conjunction with the description of the operation of the circuit of FIG. 2 hereinbelow. Detector 44 is provided with second input 102 shown connected to a source of threshold voltage $V_{th}$ through terminal 104. Voltage source $V_{th}$ will be understood to either an actual external voltage source or, as is preferred in accordance with this invention, a representation of the threshold voltage of a device contained wholly on a single integrated circuit substrate and having a threshold voltage due to the construction of the device which is, in fact, $V_{th}$, a voltage source not actually existing in that case. Detector 44 includes output 106 which provides a signal indicative of the level of voltage applied to input terminal 42 with respect to that applied to input terminal 102. The state of output 106 changes each time the voltage applied to input 42 increases beyond that applied to input 102 and the output again reverts to its orginal state when the voltage applied to input 42 falls below that applied to input 102. Insofar as $V_{th}$ is presumed to be a relatively constant voltage, and is, in fact, presumed to be constant over a short time interval, the function of detector 44 is to provide a threshold detector.

A capacitance sensor in accordance with an alternative embodiment of this invention is illustrated in FIG. 3. Many of the elements of the device of FIG. 3 correspond to those of FIG. 2 and are designated therefore by like reference numerals. The distinction between the embodiments of this invention illustrated at FIGS. 2 and 3 lies in the connection of capacitor $C_x$. In accordance with the embodiment of FIG. 2, reference capacitor $C_r$ and unknown capacitor $C_x$ are connected in alternating fashion such that either capacitor $C_r$ or capacitor $C_x$ is always connected to the node between devices 70 and 80. In accordance with the structure of FIG. 3, however, capacitor $C_r$ is permanently connected and capacitor $C_x$ is alternately connected and disconnected. Therefore, in accordance with FIG. 2 comparison is made between the values of $C_x$ and $C_r$ directly while in accordance with FIG. 3 comparision is made between the value of $C_r$ alone and the value of the combination of $C_r$ and $C_x$.

The operation of the circuits of FIGS. 2 and 3 may be most readily understood by referring now both to the figures and to FIG. 4 wherein certain of the voltages utilized in the operation of the device of FIG. 2 are illustrated with respect to time as waveform diagrams. In all cases, the time scales are the same so that events occurring substantially simultaneously are in vertical alignment.

FIGS. 4g and 4h illustrate the waveforms supplied to terminals 88 and 90, respectively, which will hereinafter be referred to as 02 and 01. Waveforms 01 and 02 alternate between zero and $-V_g$ which is a voltage sufficient to turn on a semiconductor switch of the type exemplified, for example, by device 70. The exact value of $V_g$ may be varied by one skilled in the art in accordance with well known principles. Similarly, $V_g$ may be either positive or negative depending upon the type of device chosen as the switching device in accordance with this invention. For example, wherein p-channel MOS devices are utilized, $V_g$ is negative. In accordance with convention, the waveforms of FIGS. 4a –4h are illustrated as increasing in a negative direction towards the bottom of the drawing.

Referring now to FIG. 4a wherein the voltage at node 46 is illustrated, it is convenient to consider a measurement cycle as including a number of distinct periods. Refer now to FIG. 4, these periods are indicated by the brackets at the top of the figure. A ZERO period begins at time $t_1$ and ends at time $t_6$. At time $t_1$ the voltage at node 46 decreases from the threshold voltage to $V_p$ as transistor 62 is energized by the application of a signal to terminal 66 as indicated at FIG. 4b. At the same time, transistor 50 is energized to connect node 48 of capacitor 40 to ground. The signal applied to gate terminal 58 of transistor switch 50 is illustrated at FIG. 4d. During the ZERO period, the signal applied to gate terminal 94 of transistor 74 which is designated $O_R$ is also negative such that transistor 74 is turned on and capacitor $C_r$ is connected from between the transistor 70 and 80 to ground. During the period from the time immediately preceding time $t_1$, the voltage applied to gate electrode 68 of transistor switch 62 is, as illustrated at FIG. 4b, negative so as to turn on transistor switch 62 and apply voltage source $V_p$ to node 46 of capacitor 40. Accordingly, at time $t_1$, the voltage at node 46 which voltage is detected by detector 44 is $V_p$. From time $t_1$ to $t_5$, voltages 01 and 02 which are connected respectively to terminals 90 and 88 toggle between zero and a value sufficient to turn on the transistor switches in the invention which value has been hereinabove designated as $V_g$. The toggling of the voltages illustrated in FIGS. 4g and 4h causes charge to be transferred into capacitor 40 in amounts which may be expressed as $$\Delta q = C_r(V_g - V_c - V_t)$$

wherein $\Delta q$ is the amount of charge transferred, $C_r$ is the value of reference capacitor $V_t$ is the threshold voltage of transistor 70, and $V_c$ is the voltage applied to terminal 82. During the period from time $t_1$ to $t_5$ the voltage at node 46 increases in a step-wise fashion as shown in FIG. 4a, until the threshold voltage is reached at which time an output signal is produced as illustrated at FIG. 4i by detector 44. This output signal is applied to control means 100 which control means terminates the ZERO portion of the cycle. A time $t_6$, transistor 52 is turned on while simultaneously transistor 50 is turned off thus switching the voltage at node 48 from zero volts to the voltage applied to node 60 which is conveniently, and in accordance with this invention, a reference voltage designated herein as $V_{REF}$. Charge packets are continued to be transferred to capacitor 40 during the period from time $t_6$ to time $t_{12}$ at which point the threshold voltage is again reached, detector 44 provides another output signal and the signal to gates 54 and 58 of transistors 50 and 52 are once again reversed. The number of charge transfers, $N_r$, required to increase the voltage at node 46 from its value at the beginning of the reference period to the threshold voltage is inversely related to the magnitude of $C_r$ and directly related $V_{REF}$. From time $t_{13}$ to time $t_{18}$ a second zero period occurs which is initiated by the reaching of the threshold voltage at time $t_{12}$ and is preceded at time $t_{13}$ by a turn-on signal applied to terminal 66 which is illustrated at FIG. 4b in which once again precharges node 46 to $V_p$. At time $t_{18}$ a MEASURE PERIOD commences. As illustrated at FIGS. 4e and 4f the signals applied to terminals 96 and 98 which energize transistors 72 and 74, respectively, change and in each case from the state which existed prior to time $t_{18}$ to the opposite state, that is to say, transistor 72 turns from off to on while transistor 74 turns from on to off thus connecting capacitor $C_x$ in place of capacitor $C_r$ to the node between transistor switches 80 and 70. In accordance with this illustrative example of the invention it is assumed that capacitor $C_x$ is larger in magnitude than capacitor $C_r$ and, therefore, that during each charge transfer from time $t_{18}$ to time $t_{22}$ a greater amount of charge is transferred to capacitor 40 than was heretofore the case during the periods when capacitor $C_r$ was connected. Accordingly, a lesser number of transfers, $N_x$, is required before the threshold voltage of detector 44 is reached. The amount of charge transferred during each transfer cycle of the MEASURE PERIOD is equal to $$q_{MEASURE} = C_x(V_g - V_c - V_t)$$

this will be recognized to be in the same form as the amount of charge transferred during the reference cycle from time $t_6$ to time $t_{13}$. The magnitude of capacitor $C_x$ may readily be computed according to $$C_x = N_r C_r / N_x$$

wherein $N_r$ is the number of transfers required to reach the threshold level during the reference period and $N_x$ is the number of counts required to reach the threshold voltage during the MEASURE period. In accordance with this invention, control means 100 incorporates counter means for counting the number of transfers $N_r$ and $N_x$, which, in fact, is equal to the number of full cycles of either 01 or 02 which occur during the REFERENCE and MEASURE periods, respectively. Counters are well known in the art and as such are not specifically illustrated in accordance with this invention. The precise form of control means 100 may be readily conceived by one skilled in the art and varied accordingly depending upon the form of output desired. An exemplary form of this invention utilizes parallel outputs 110 which provide an output signal indicative of the number of counts in the reference and measure periods, respectively, at the end of said periods. The capacitance sensor of this invention in accordance with FIG. 2 is especially well suited to be utilized on conjunction with a microprocessor or the like for storing the counts provided during the REFERENCE and MEASUREMENT portions of the cycle. The relationship hereinabove described between the number of counts in the MEASURE and REFERENCE periods and the values of the unknown and reference capacitors may be readily computed in order to yield the value of the unknown capacitance.

The capacitance sensors of FIGS. 2 and 3 are especially well suited to be incorporated in touch sensor circuits. In a presently preferred embodiment of this invention, the capacitance of a touch plate is continuously measured and the digital number produced as a value of capacitances stored, as for example, in a semiconductor memory. Where a plurality of touch pads is utilized a number of capacitance values which is equal to the number of pads is stored. Conveniently, a plurality of pads may be scanned in an $x,y$ addressing manner by a single capacitance sensor which provides a serial train of capacitance values which are conveniently stored in a memory. The touching of a particular pad by an operator produces a change in the capacitance of that pad which change may be readily discerned by continuously comparing the values of capacitance detected by the capacitance sensor to the storage values in memory. In this way, the absolute value of any capacitance is not of substantial importance but rather the change in value is utilized in order to make a decision as to whether a pad is touched. FIG. 3 illustrates a capacitance sensor in accordance with an alternative embodiment of this inventon. The operation of the circuit of FIG. 3 is substantially the same as that of FIG. 2 except that the connection of capacitors $C_x$ and $C_r$ during the conversion cycle is somewhat different. In accordance with the schematic of FIG. 3, capacitor $C_r$ is always connected in the circuit while capacitor $C_x$ is selectively connected during a portion of the measurement cycle. The capacitances of interest in determining the magnitude of $C_x$ are, therefore, the capacitance of $C_r$ and the combined capacitance of $C_x$ and $C_r$. Transistor switch 72 connects $C_x$ to $C_r$ during the MEASURE portion of the conversion cycle upon the application of a voltage of the form shown in FIG. 4c. Since, in all cases, the combined capacitance of $C_x$ and $C_r$ are in parallel, the total capacitance of the combination will be greater than the capacitance of $C_r$ alone and a lesser number of transfers will be required to reach the preselected threshold level during the MEASURE portion of the conversion cycle. The capacitance of $C_x$ may be determined according to the relationship $$C_x = C_r\left(\frac{N_r}{N_x} - 1\right)$$

The circuit of FIG. 3 may be especially advantageous when the expected value of the unknown capacitance $C_x$ is especially small and a large number of charge transfers would be required in order to reach the preselected threshold level.

Those skilled in the art will appreciate that other arrangements of $C_r$ and $C_x$ during the REFERENCE and MEASURE periods, respectively, may be accomplished. For example, the MEASURE period may include the combination of $C_x$ and $C_r$ in series with appropriate use of switches of the form of switches 72 and 74.

The circuits of FIGS. 2 and 3 provide substantially greater versatility than the prior art circuit of FIG. 1. It is a feature of this invention that the resolution of a capacitance sensor in accordance herewith may be varied by adjusting the value of $V_{REF}$. As $V_{REF}$ is increased, the number of transfers required to reachieve the preselected threshold voltage is increased and the resolution of the devices, therefore, are increased. It will be appreciated that increased resolution is achieved at some sacrifice in the rate of conversion. In many cases, however, a rapid conversion rate is not essential or even desirable and, therefore, the high resolution offered by this invention may be beneficially utilized.

It is an important feature of this invention as described in conjunction with the foregoing figures that the necessity, present in the prior art, for providing a relatively large voltage to the capacitive touch plate in order to insure that a sufficient change in level would occur at a receiver upon the touching of a touch plate by an operator, is eliminated. A touch sensor in accordance with this invention operates with a voltage which may be adjusted according to the particular application therefore, but which, in any case, may quite readily be maintained at a value under 10 volts or the like. The maximum voltage present at capacitor $C_r$ is, in the case of the circuit of FIG. 2, for example, is $V_g - V_h$, typically 10 volts or less. This low voltage operation in comparison with prior art touch sensors is made possible by measuring the actual capacitance of a touch plate rather than by measuring a change in voltage caused by the capacitance of a touch plate. The need for a transmitter or signal generator is eliminated thereby decreasing the complexity of the circuit while at the same time reducing the voltage thereon.

The capacitance sensors of FIGS. 2 and 3 exhibit the additional advantage that many of the unstabilizing effects which compromised the performance of prior art touch sensors are eliminated. As was hereinabove described, a measurement cycle includes a zero period wherin, immediately before each measurement is taken, the capacitance sensor portion of a touch sensor in accordance with this invention is calibrated. The major sources of error are thereby eliminated. For example, changes in threshold voltage of detector 44 do not effect the accuracy of measurement so long as good short term stability is provided. It is required only that the threshold voltage be maintained substantially constant during a zero period and a subsequent REFERENCE or MEASURE period. Insofar as these portions of the measurement cycle occur in times substantially less than a second, and in accordance with presently preferred embodiments of this invention, in milliseconds, long term drift is eliminated as a degrading factor. Thermal stability is likewise not a factor since, as is well known, thermal changes occur relatively slowly with respect to the time for measurement of this invention. A chain of components is likewise not a factor. Since the threshold voltage of detector 44 is approached during each portion of the measurement cycle, from the same direction, it is a feature of this invention that hysteresis plays no part in reducing the accuracy of measurement. A more complete explanation of the various error eliminating features of this invention may be had to reference to U.S. patent applications Ser. No. 628,401, filed Nov. 3, 1975, of Eichelberger for ANALOG-TO-DIGITAL CONVERTER which is assigned to the assignee of the instant invention and which is incorporated herein by reference.

FIG. 5 illustrates in block diagram form an exemplary touch sensor in accordance with this invention. A plurality of capacitors 112 through 121 are provided having one terminal connected to switch means 124 for continuously scanning the capacitors. Switch means 124 may be of any convenient type as, for example, semiconductor switch means or rotary mechanical switch means or the like. At any time, one of capacitors 112 through 121 is connected to input 126 of capacitance sensor 128 which is of the type hereinabove described in conjunction with FIGS. 2, 3 and 4. Capacitance sensor 128 is connected to each of capacitors 112 through 121 for a sufficient time to determine the capacitance thereof and provide an output signal indicative of the magnitude of capacitance at output terminals 130 which are connected to digital processor 132. Digital processor 132 includes memory means 134 for storing the values of capacitance measured by capacitance sensor 128 and for continuously comparing the new values to the stored values. Digital processor 132 further includes means for determining, in accordance with a preselected decision criteria, whether the capacitance of one of capacitors 112 through 121 had changed sufficiently to indicate that a touching has occurred. Output 136 of digital processor 132 is connected to utilization means 138 which may be whatever apparatus is desired to be controlled by the touch sensor.

Where it is desired to minimize the complexity of a touch sensor in accordance with this invention, the circuit of FIG. 5 may be modified by eliminating therefrom a circuit 134 and digital processor 132 and by providing capacitances 112 through 121 of substantially equal magnitude. In this way, a decision may be made as to a touch or non-touched condition by comparing the output signal appearing at output 130 of capacitance sensor 138 to a fixed reference signal or range of reference signals.

While the invention has been particularly shown and described with reference to several preferred embodiments thereof, it will be understood by those skilled in the art that various changes in form and detail may be made therein without departing from the true spirit and scope of the invention as defined by the appended claims.

WHAT IS CLAIMED IS:

1. A capacitance sensor for measuring the magnitude of an unknown capacitance and providing a digital output comprising:

primary charge storage means;

sensor means connected to said primary charge storage means providing an output signal when the level of charge in said primary charge storage means equals or exceeds a preselected level;

secondary charge storage means selectively connected to said primary charge storage means for transferring a plurality of charge packets to said primary charge storage means during a first measurement period until said preselected level is reached;

means for selectively connecting said unknown capacitance to said primary charge storage means during a second measurement period so that the magnitude of the charge packets in a second plurality of charge packets is proportional to the magnitude of said unknown capacitance, and for sequentially transferring said second plurality of charge packets to said primary charge storage location during said second measurement period until said preselected level is again reached;

digital counting means responsive to said output signal for counting the number of charge transfers required to reach said preselected level during said first and second periods.

2. The capacitance sensor of claim 1 wherein said primary charge storage means comprises a first capacitor and said secondary charge storage means comprises a second capacitor having a capacitance less than the capacitance of said first capacitor.

3. The capacitance sensor of claim 2 wherein said sensor means comprises threshold voltage detector means connected to said first capacitor responsive to a preselected threshold voltage level in said first capacitor to provide an output signal whenever the voltage in said capacitor equals or exceeds said preselected level.

4. The capacitance sensor of claim 2 further comprising precharging means selectively connected to said first capacitor for setting the level of charge in said capacitor below said preselected level at the beginning of said first measurement period.

5. The capacitance sensor of claim 1 wherein said primary charge storage means includes first and second terminals, said first terminal connected as described in claim 1; and further comprising switch means for connecting said second terminal to ground during said first measurement period and for connecting said second terminal to a reference voltage source during said second measurement period.

6. Capacitance measurement apparatus comprising:
first relatively large charge storage means;
second relatively small charge storage means;
means connected to said first and said second charge storage means for successively transferring a metered number of charge packets from said second to said first charge storage means;
means for filling said second charge storage means after each transfer;
means connecting an unknown capacitance to said second charge storage means during a first period to form a total capacitance equal to the combination of the capacitance of said second charge storage means and that of said unknown capacitance and for isolating said unknown capacitance from said second charge storage means during a second period;
means connected to said first charge storage means responsive to a preselected threshold voltage level therein for providing an output signal when the level of voltage equals or exceeds said preselected threshold level;
control means responsive to said output signal for initiating whichever of said first and second periods is not occurring when said output signal is received, the number of metered charge packets required to achieve said threshold voltage level in each of said second and first periods being inversely proportional to the ratio of the said capacitance of said second charge storage means to the capacitance of the combination of said second charge storage means and said unknown capacitance respectively.

7. A capacitance touch sensor comprising:
a capacitive touch plate;
capacitive measuring means for providing a digital output signal corresponding to the magnitude of the capacitance of said capacitive touch plate during a plurality of discrete time intervals;
memory means for storing said digital output signals;
means for comparing the capacitance of said capacitive touch plate at a given time to the stored digital output signal and for providing an output signal whenever said capacitance differs from said stored signal according to a preselected criterion.

8. The capacitive touch sensor of claim 7 further comprising:
a plurality of capacitive touch plates;
switch means for sequentially connecting each of said touch plates to said capacitance measuring means;
memory means for storing the digital values of said plurality of capacitances;
means for comparing the value of the capacitance of each capacitive touch plate with the stored value of capacitance for the same touch plate, and for generating an output signal when the most recent value of capacitance differs from said stored value according to a preselected criterion.

9. The capacitive touch sensor of claim 7 wherein said capacitive measuring means comprises:
primary charge storage means;
sensor means connected to said primary charge storage means providing an output signal when the level of charge in said primary charge storage means equals or exceeds a preselected level;
secondary charge storage means selectively connected to said primary charge storage means for transferring a plurality of charge packets to said primary charge storage means during a first measurement period until said preselected level is reached;
means for selectively connecting said unknown capacitance to said primary charge storage means during a second measurement period so that the magnitude of the charge packets in a second plurality of charge packets is proportional to the magnitude of said unknown capacitance, and for sequentially transferring said second plurality of charge packets to said primary charge storage location during said second meansurement period until said preselected level is again reached;
digital counting means responsive to said output signal for counting the number of charge transfers required to each said preselected level during said first and second periods.

10. The capacitance sensor of claim 9 wherein said primary charge storage means comprises a first capacitor and said secondary charge storage means comprises a second capacitor having a capacitance less than the capacitance of said first capacitor.

11. The capacitance sensor of claim 9 wherein said sensor means comprises threshold voltage detector means connected to said first capacitor responsive to a preselected threshold voltage level in said first capacitor to provide an output signal whenever the voltage in said capacitor equals or exceeds said preselected level.

12. The capacitance sensor of claim 9 further comprising precharging means selectively connected to said first capacitor for setting the level of charge in said capacitor below said preselected level at the beginning of said first measurement period.

13. The capacitance sensor of claim 9 wherein said primary charge storage means includes first and second terminals, said first terminal connected as described in claim 9; and
further comprising switch means for connecting said second terminal to ground during said first measurement period and for connecting said second terminal to a reference voltage source during said second measurement.

* * * * *